(12) United States Patent
Ozawa et al.

(10) Patent No.: US 10,147,868 B2
(45) Date of Patent: Dec. 4, 2018

(54) POLYMER COMPOSITE PIEZOELECTRIC BODY, ELECTROACOUSTIC TRANSDUCTION FILM, AND ELECTROACOUSTIC TRANSDUCER

(71) Applicant: FUJIFILM Corporation, Tokyo (JP)

(72) Inventors: Shin Ozawa, Ashigara-kami-gun (JP); Takami Arakawa, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/701,026

(22) Filed: Sep. 11, 2017

(65) Prior Publication Data

US 2017/0373243 A1    Dec. 28, 2017

Related U.S. Application Data

(63) Continuation of application No. PCT/JP2016/054375, filed on Feb. 16, 2016.

(30) Foreign Application Priority Data

Mar. 12, 2015 (JP) .................................. 2015-049209

(51) Int. Cl.
*H04R 17/00* (2006.01)
*H01L 41/18* (2006.01)
(Continued)

(52) U.S. Cl.
CPC .............. *H01L 41/183* (2013.01); *B06B 1/06* (2013.01); *B06B 1/0603* (2013.01);
(Continued)

(58) Field of Classification Search
CPC ................. H01L 41/183; H01L 41/047; H01L 41/0533; H01L 41/09; H01L 41/113;
(Continued)

(56) References Cited

U.S. PATENT DOCUMENTS 9,761,784 B2 * 9/2017 Miyoshi ................... H04R 7/04
2011/0074249 A1   3/2011 Sakashita et al.
(Continued)

FOREIGN PATENT DOCUMENTS

JP    2008-294493 A    12/2008
JP    2011-91371 A    5/2011
(Continued)

OTHER PUBLICATIONS

International Search Report for PCT/JP2016/054375 (PCT/ISA/210) dated May 17, 2016.
(Continued)

*Primary Examiner* — C Melissa Koslow
(74) *Attorney, Agent, or Firm* — Birch, Stewart, Koalsch & Birch, LLP

(57) ABSTRACT

Provided are a polymer composite piezoelectric body in which the conversion efficiency between electricity and sound is increased and thus the sound pressure level is improved, an electroacoustic transduction film, and an electroacoustic transducer. The polymer composite piezoelectric body includes a viscoelastic matrix formed of a polymer material having a cyanoethyl group, piezoelectric body particles which are dispersed in the viscoelastic matrix and have an average particle diameter of more than or equal to 2.5 μm, and dielectric particles dispersed in the viscoelastic matrix, in which the dielectric particles are formed of a material different from that of the piezoelectric body particles and have an average particle diameter of less than or equal to 0.5 μm and a relative permittivity of more than or equal to 80.

22 Claims, 5 Drawing Sheets

(51) Int. Cl.
   *H01L 41/09* (2006.01)
   *H01L 41/113* (2006.01)
   *B06B 1/06* (2006.01)
   *H01L 41/047* (2006.01)
   *H01L 41/053* (2006.01)
   *H01L 41/257* (2013.01)
   *H01L 41/29* (2013.01)
   *H01L 41/37* (2013.01)

(52) U.S. Cl.
   CPC .......... *B06B 1/0607* (2013.01); *H01L 41/047* (2013.01); *H01L 41/0533* (2013.01); *H01L 41/09* (2013.01); *H01L 41/113* (2013.01); *H01L 41/18* (2013.01); *H01L 41/257* (2013.01); *H01L 41/29* (2013.01); *H01L 41/37* (2013.01); *H04R 17/005* (2013.01)

(58) Field of Classification Search
   CPC .......... H01L 41/18; H01L 41/37; B06B 1/06; B06B 1/0603; B06B 1/0607; H04R 17/00; H04R 17/005
   See application file for complete search history.

(56) References Cited

U.S. PATENT DOCUMENTS

| | | | |
|---|---|---|---|
| 2011/0217519 A1 | 9/2011 | Sakashita | |
| 2012/0038249 A1 | 2/2012 | Lu et al. | |
| 2013/0256581 A1* | 10/2013 | Miyoshi | C08K 3/04 |
| | | | 252/62.9 PZ |
| 2014/0210309 A1 | 7/2014 | Miyoshi | |

FOREIGN PATENT DOCUMENTS

| | | | |
|---|---|---|---|
| JP | 2011-181866 A | | 9/2011 |
| JP | 2014-14063 A | | 1/2014 |
| WO | WO 2013/047875 | * | 4/2013 |

OTHER PUBLICATIONS

Written Opinion of the International Searching Authority for PCT/JP2016/054375 (PCT/ISA/237) dated May 17, 2016.
Japanese Office Action issued in Japanese Patent Application No. 2017-504939 dated Dec. 12, 2017.

* cited by examiner

US 10,147,868 B2

POLYMER COMPOSITE PIEZOELECTRIC BODY, ELECTROACOUSTIC TRANSDUCTION FILM, AND ELECTROACOUSTIC TRANSDUCER

CROSS-REFERENCE TO RELATED APPLICATIONS

This application is a Continuation of PCT International Application No. PCT/JP2016/054375 filed on Feb. 16, 2016, which claims priority under 35 U.S.C. § 119(a) to Japanese Patent Application No. 2015-049209 filed on Mar. 12, 2015. The above application is hereby expressly incorporated by reference, in its entirety, into the present application.

BACKGROUND OF THE INVENTION

1. Field of the Invention

The present invention relates to a polymer composite piezoelectric body, an electroacoustic transduction film, and an electroacoustic transducer.

2. Description of the Related Art

In response to thinning of displays such as liquid crystal displays and organic electroluminescence (EL) displays, speakers used in such thin displays are also required to be lighter and thinner. Further, in flexible displays having flexibility, speakers are required to be flexible so as to be integrated into the flexible displays without impairing lightweight properties and flexibility. As such a lightweight and thin speaker having flexibility, it is considered to adopt a sheet-like piezoelectric film having a property that stretches and contracts in response to an applied voltage.

For example, in JP2008-294493A, it is described that a piezoelectric film obtained by performing polarization processing with respect to a monoaxially stretched film of polyvinylidene fluoride (PVDF) at a high voltage is used.

In order to adopt the piezoelectric film as a speaker, is necessary that a stretching and contracting movement along a film surface is converted into a vibration of the film surface. This conversion from the stretching and contracting movement into the vibration is attained by holding the piezoelectric film in a bent state, and thus the piezoelectric film is able to function as a speaker.

However, since the piezoelectric film foil led of monoaxially stretched PVDF has an in-plane anisotropy in the piezoelectric properties thereof, the acoustic quality greatly varies depending on the bending direction even with the same curvature.

Furthermore, since PVDF has a smaller loss tangent than a general vibration plate for a speaker such as cone paper, a strong resonance is easily generated, and strong undulation is included in frequency properties. Accordingly, the changed amount of the acoustic quality at the time that the lowest resonance frequency is changed according to a change in the curvature increases.

Thus, in a piezoelectric film formed of PVDF, it is difficult to reproduce a stable sound.

Here, the present applicants suggested, as a speaker which has flexibility and is capable of stably reproducing a sound with high acoustic quality, an electroacoustic transduction film (piezoelectric film) including a polymer composite piezoelectric body in which piezoelectric body particles are dispersed in a viscoelastic matrix formed of a polymer material having viscoelasticity at a normal temperature, thin film electrodes formed on both surfaces of the polymer composite piezoelectric body, and protective layers formed on the surfaces of the thin film electrodes, which is disclosed in JP2014-14063A.

SUMMARY OF THE INVENTION

In such a piezoelectric film, it is further required to increase the conversion efficiency between electricity and sound and improve the sound pressure level by. In general, in a piezoelectric body, the conversion efficiency between electricity and pressure depends on the relative permittivity of the piezoelectric body, and the higher the relative permittivity is, the higher the conversion efficiency is.

Therefore, in order to further increase the conversion efficiency in the piezoelectric film using the above-described polymer composite piezoelectric body as a piezoelectric layer, it is considered that the volume fraction of the piezoelectric body particles in the piezoelectric layer is increased, the dielectric constant of the matrix (binder) is improved, and the film thickness of the piezoelectric layer is increased.

However, when the volume fraction of the piezoelectric body particles in the piezoelectric layer is increased, the flexibility decreases, the interfacial peeling between the piezoelectric body particles and the binder occurs due to the vibration during driving and bending of the piezoelectric film, voids are formed, the interfacial peeling between the piezoelectric body particles and the binder occurs due to the vibration during driving and bending of the piezoelectric film, voids are formed, and the dielectric constant of the piezoelectric layer decreases. Therefore, the conversion efficiency decreases and the sound pressure decreases.

Also, there is a limit to increasing the dielectric constant of the binder itself due to the selectivity of a material that is able to be used as the binder.

In addition, if the piezoelectric layer is too thick, the piezoelectric layer may be bent by its own weight, or the piezoelectric film may not appropriately vibrate due to its heavy weight, possibly leading to a decrease in the sound pressure or acoustic quality.

The present invention has been made in view of the above problems, and an object thereof is to provide a polymer composite piezoelectric body in which the conversion efficiency between electricity and sound is increased and thus the sound pressure level is improved, an electroacoustic transduction film, and an electroacoustic transducer.

The present inventors have intensively studied to attain the object, and found that by providing a viscoelastic matrix formed of a polymer material having a cyanoethyl group, piezoelectric body particles which are dispersed in the viscoelastic matrix and have an average particle diameter of more than or equal to 2.5 μm, and dielectric particles dispersed in the viscoelastic matrix and causing the dielectric particles to be formed of a material different from that of the piezoelectric body particles and have an average particle diameter of less than or equal to 0.5 μm and a relative permittivity of more than or equal to 80, the conversion efficiency between electricity and sound can be increased and thus the sound pressure level can be improved, thereby completing the present invention.

That is, the present invention provides a polymer composite piezoelectric body having the following configuration, an electroacoustic transduction film, and an electroacoustic transducer.

(1) A polymer composite piezoelectric body comprising: a viscoelastic matrix formed of a polymer material having a cyanoethyl group; piezoelectric body particles which are dispersed in the viscoelastic matrix and have an average particle diameter of more than or equal to 2.5 μm; and dielectric particles dispersed in the viscoelastic matrix, in which the dielectric particles are formed of a material different from that of the piezoelectric body particles and have an average particle diameter of less than or equal to 0.5 μm and a relative permittivity of more than or equal to 80 at 25° C.

(2) The polymer composite piezoelectric body according to (1), in which a volume fraction of the dielectric particles with respect to a total volume of the viscoelastic matrix and the dielectric particles is 5% to 45%.

(3) The polymer composite piezoelectric body according to (1) or (2), in which the average particle diameter of the dielectric particles is 0.1 μm to 0.5 μm.

(4) The polymer composite piezoelectric body according to any one of (1) to (3), in which the dielectric particles are formed of barium titanate.

(5) The polymer composite piezoelectric body according to any one of (1) to (4), in which the viscoelastic matrix is formed of a polymer material having viscoelasticity at a normal temperature.

(6) The polymer composite piezoelectric body according to any one of (1) to (5), in which a glass transition temperature of the polymer material at a frequency of 1 Hz is 0° C. to 50° C.

(7) The polymer composite piezoelectric body according to any one of (1) to (6), which a local maximum value of the polymer material at which a loss tangent Tanδ at a frequency of 1 Hz according to dynamic viscoelasticity measurement is greater than or equal to 0.5 is present in a temperature range of 0° C. to 50° C.

(8) The polymer composite piezoelectric body according to any one of (1) to (7), in which the polymer material is cyanoethylated polyvinyl alcohol.

(9) An electroacoustic transduction film comprising: a piezoelectric layer using the polymer composite piezoelectric body according to any one of (1) to (8); thin film electrodes formed on both surfaces of the piezoelectric layer; and protective layers laminated on the thin film electrodes.

(10) The electroacoustic transduction film according to (9), in which a thickness of the piezoelectric layer is 15 μm to 25 μm.

(11) The electroacoustic transduction film according to (9) or (10), in which a storage elastic modulus E' of the electroacoustic transduction film at a frequency of 1 Hz according to dynamic viscoelasticity measurement is 10 to 30 GPa at 0° C. and 1 to 10 GPa at 50° C.

(12) An electroacoustic transducer comprising: the electroacoustic transduction film according to any one of (9) to (11).

According to the polymer composite piezoelectric body, the electroacoustic transduction film, and the electroacoustic transducer of the present invention, the conversion efficiency between electricity and sound can be increased and thus the sound pressure level can be improved.

DESCRIPTION OF THE PREFERRED EMBODIMENTS

Hereinafter, a polymer composite piezoelectric body, an electroacoustic transduction film, and an electroacoustic transducer of the present invention will be described in detail based on the preferred embodiments shown in the accompanying drawings.

Descriptions of the constituent elements described below may be made based on representative embodiments of the present invention, but the present invention is not limited to the embodiments.

In this specification, a numerical range expressed by using "to" means a range including numerical values described before and after "to" as a lower limit and an upper limit.

Figure 1:
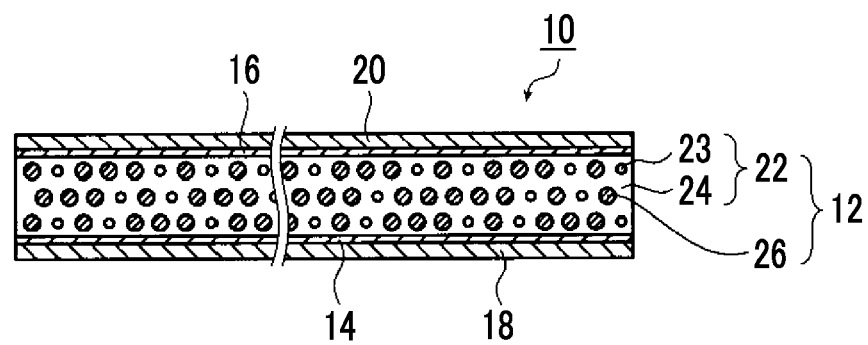
FIG. 1 is a sectional view conceptually illustrating an example of an electroacoustic transduction film of the present invention.

FIG. 1 is a sectional view conceptually illustrating an example of an electroacoustic transduction film which uses a polymer composite piezoelectric body of the present invention as a piezoelectric layer.

The electroacoustic transduction film is used as a vibration plate of an electroacoustic transducer as described later.

In the electroacoustic transducer, when the electroacoustic transduction film is stretched in an in-plane direction due to the application of a voltage to the electroacoustic transduction film, the electroacoustic transduction film moves upward (in the radial direction of sound) in order to absorb the stretching. Conversely, when the electroacoustic transduction film is contracted in the in-plane direction due to the application of a voltage to the electroacoustic transduction film, the electroacoustic transduction film moves downward (toward a case) in order to absorb the contraction. The electroacoustic transducer performs a conversion between vibrations (sound) and electrical signals by vibrations caused by repetition of stretching and contraction of the electroacoustic transduction film, and is used to reproduce a sound from a vibration in response to an electrical signal by inputting the electrical signal to the electroacoustic transduction film, convert a vibration of the electroacoustic transduction film from received sound waves into an electrical signal, or impart tactility or transport an object from vibrations.

Specifically, various acoustic devices including a speaker such as a full-range speaker, a tweeter, a squawker, and a woofer, a speaker for a headphone, a noise canceller, a microphone, a pickup used in musical instruments including a guitar, and the like can be cited. In addition, since the electroacoustic transduction film of the present invention is a non-magnetic body, the electroacoustic transduction film is able to be suitably used as a noise canceller for MRI among noise cancellers. The electroacoustic transduction film is also able to be used as a device for imparting a tactile sensation to an optical keyboard.

Furthermore, the electroacoustic transduction film of the present invention is thin, lightweight, and bendable and is thus suitably used in wearable products such as hats, mufflers and clothes, thin displays such as televisions and digital signages, ceilings of buildings and automobiles, curtains, umbrellas, wallpapers, windows, beds, and the like.

An electroacoustic transduction film illustrated in FIG. 1 (hereinafter, also referred to as "transduction film") 10 is configured to include a piezoelectric layer 12 which is a sheet-like material having piezoelectric properties, a lower thin film electrode 14 and an upper thin film electrode 16 respectively provided on one surface and the other surface of the piezoelectric layer 12, a lower protective layer 18 provided on the surface of the lower thin film electrode 14, and an upper protective layer 20 provided on the surface of the upper thin film electrode 16. In addition, the thickness of the piezoelectric layer 12 of the transduction film 10 is less than 30 μm.

In the transduction film 10, the piezoelectric layer 12 is a polymer composite piezoelectric body.

As conceptually illustrated in FIG. 1, the polymer composite piezoelectric body forming the piezoelectric layer 12 includes piezoelectric body particles 26 and dielectric particles 23 dispersed in a viscoelastic matrix 24 formed of a polymer material having a cyanoethyl group.

Here, in the present invention, the average particle diameter of the piezoelectric body particles 26 in the piezoelectric layer 12 is more than or equal to 2.5 μm, and the dielectric particles 23 are formed of a material different from that of the piezoelectric body particles 26 and have an average particle diameter of less than or equal to 0.5 μm and a relative permittivity of more than or equal to 80.

The polymer composite piezoelectric body configuring the piezoelectric layer 12 is the polymer composite piezoelectric body of the present invention.

Since the polymer composite piezoelectric body of the present invention has such a configuration, the conversion efficiency between electricity and sound can be increased, and thus the sound pressure level can be improved.

This point will be described in detail later.

In addition, the piezoelectric layer 12 is preferably subjected to polarization processing.

The transduction film 10 is suitably used in a speaker having flexibility such as a speaker for a flexible display. Here, it is preferable that the polymer composite piezoelectric body (the piezoelectric layer 12) used in a speaker having flexibility has the following requisites.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, when the polymer composite piezoelectric body is hard, large bending stress is generated to that extent, and a crack is generated at the interface between the polymer matrix and the piezoelectric body particles, possibly leading to breakage. Accordingly, the polymer composite piezoelectric body is required to have suitable flexibility. In addition, when strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy such that a sound is reproduced. Accordingly, in order to increase the transmission efficiency of the vibration energy, the polymer composite piezoelectric body is required to have suitable hardness. In addition, when the frequency properties of the speaker become smooth, the changed amount of the acoustic quality at the time of when the lowest resonance frequency $f_0$ changes according to a change in the curvature also decreases. Accordingly, the loss tangent of the polymer composite piezoelectric body is required to be suitably large.

As described above, the polymer composite piezoelectric body used in the speaker having flexibility is required to be rigid with respect to a vibration of 20 Hz to 20 kHz, and be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among, them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

Furthermore, herein, the "normal temperature" indicates a temperature range of approximately 0° C. to 50° C.

As the polymer material having viscoelasticity at a normal temperature, a material having a cyanoethyl group is able to be used.

Preferably, a polymer material of which the local maximum value of a loss tangent Tanδ at a frequency of 1 Hz at a normal temperature, that is, 0° C. to 50° C. in a dynamic viscoelasticity test is greater than or equal to 0.5 is used.

Accordingly, when the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time of when the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, when a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As polymer materials satisfying such conditions, cyanoethylated polyvinyl alcohol (cyanoethylated PVA) is exemplified.

Particularly, cyanoethylated PVA is preferably used.

Furthermore, only one of these polymer materials may be used, or a plurality of types thereof may be used in combination (mixture).

The viscoelastic matrix 24 using such a polymer material having a cyanoethyl group, as necessary, may use another polymer material having viscoelasticity at a normal temperature.

As the polymer material having viscoelasticity at a normal temperature, polyvinyl acetate, polyvinylidene chloride-co-acrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used.

The viscoelastic matrix 24 using such a polymer material having a cyanoethyl group, as necessary, may use a plurality of polymer materials in combination.

That is, in order to adjust dielectric properties or mechanical properties, other dielectric polymer materials may be added to the viscoelastic matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the viscoelastic matrix 24 of the piezoelectric layer 12 in addition to the material having viscoelasticity at a normal temperature such as cyanoethylated PVA is not limited to one dielectric polymer, and a plurality of dielectric polymers may be added.

In addition, in order to adjust the glass transition point (Tg), a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the viscoelastic matrix 24 of the piezoelectric layer 12, the added amount at the time of adding a polymer in addition to the viscoelastic material such as cyanoethylated PVA is not particularly limited, and it is preferable that a ratio of the added polymer to the viscoelastic matrix 24 is less than or equal to 30 vol %.

Accordingly, it is possible to exhibit properties of the polymer material to be added without impairing the viscoelasticity relieving mechanism of the viscoelastic matrix 24, and thus a preferred result is able to be obtained from a viewpoint of increasing a dielectric constant, of improving heat resistance, and of improving adhesiveness between the piezoelectric body particles 26 and the electrode layer.

The dielectric particles 23 are formed of particles having a relative permittivity as high as 80 or more at 25° C.

As the dielectric particles 23, lead zirconate titanate (PZT), barium titanate ($BaTiO_3$), titanium oxide ($TiO_2$), strontium titanate ($SrTiO_3$), lead lanthanum zirconate titanate (PLZT), zinc oxide (ZnO), a solid solution (BFBT) of barium titanate and bismuth ferrite ($BiFe_3$), and the like are exemplified. Among them, it is preferable to use barium titanate ($BaTiO_3$) as the dielectric particles from a viewpoint of having a high relative permittivity.

As the dielectric particles 23, particles of a material (particle kind) different from that of the piezoelectric body particles 26 described below.

In the present invention, the fact that the dielectric particles and the piezoelectric body particles are formed of different materials means that the primary components configuring the respective particles are different from each other. The primary component configuring particles means the component having the highest component ratio among the particles. Therefore, materials that have the same primary component but are different in the amount of impurities or the doping amount are regarded as being the same.

The dielectric particles 23 have an average particle diameter of less than or equal to 0.5 μm.

As described above, in a piezoelectric film using, as a piezoelectric layer, a polymer composite piezoelectric body in which piezoelectric body particles are dispersed in a viscoelastic matrix formed of a polymer material having viscoelasticity at a normal temperature, in order to further increase the conversion efficiency, it is conceivable to increase the volume fraction of the piezoelectric body particles in the piezoelectric layer, improve the dielectric constant of the matrix, increase the film thickness of the piezoelectric layer, and the like.

However, when the volume fraction of the piezoelectric body particles in the piezoelectric layer is increased, the flexibility decreases, the interfacial peeling between the piezoelectric body particles and a binder occurs due to the vibration during driving and during bending of the piezoelectric film, voids are formed, and the dielectric constant of the piezoelectric layer decreases. Therefore, the conversion efficiency decreases and the sound pressure decreases.

Also, there is a limit to increasing the dielectric constant of the matrix due to the selectivity of a material that is able to be used as the matrix.

In addition, if the piezoelectric layer is too thick, the piezoelectric layer may be bent by its own weight, or the piezoelectric film may not appropriately vibrate due to its heavy weight, possibly leading to a decrease in the sound pressure or acoustic quality.

In contrast, the polymer composite piezoelectric body of the present invention has a configuration in which the dielectric particles having a relative permittivity of more than or equal to 80 and an average particle diameter of less than or equal to 0.5 μm are disposed in the viscoelastic matrix. That is, the configuration in which the dielectric particles having a high relative permittivity and a small average particle diameter are disposed in the viscoelastic matrix is provided. By dispersing the dielectric particles having a high relative permittivity, the relative permittivity of the piezoelectric body can be increased, and thus the conversion efficiency between electricity and sound can be increased. At this time, since the average particle diameter of the dielectric particles is small, even if the dielectric particles are dispersed in the viscoelastic matrix, it is possible to suppress a decrease in the flexibility. Therefore, it is possible to suppress the occurrence of the interfacial peeling between the piezoelectric body particles or the dielectric particles and the viscoelastic matrix and the formation of voids during driving or bending of the piezoelectric film. Accordingly, it is possible to prevent a decrease in the dielectric constant and prevent a decrease in the conversion efficiency.

The polymer composite piezoelectric body of the present invention can also be said to have a configuration in which piezoelectric body particles are dispersed in a binder in which minute dielectric particles are disposed in a viscoelastic matrix.

That is, by dispersing the minute dielectric particles in the viscoelastic matrix, the polymer composite piezoelectric body of the present invention is improved in the relative permittivity of the binder and is thus improved in the conversion efficiency.

Therefore, in the following description, a material in which dielectric particles are dispersed in a viscoelastic matrix is also referred to as a composite binder.

From the above viewpoint, the average particle diameter of the dielectric particles 23 is less than or equal to 0.5 μm, more preferably set to 0.1 μm to 0.5 μm, and particularly preferably set to 0.1 μm to 0.3 μm.

Here, the average particle diameter of the dielectric particles 23 means the average value of the particle diameters of the dielectric particles. In the present invention, the piezoelectric layer is cut with a microtome, and the major axis of a particle observed at a magnification at which the shape of the particle can be confirmed by a scanning electron microscope (SEM) manufactured by Hitachi High-Technologies Corporation is referred to as a particle diameter. Also, the average value of 100 particle systems measured is referred to as the average particle diameter.

In addition, it is preferable that the distribution of the particle diameters of the dielectric particles 23 satisfies a distribution that falls within a range of ±50% of the average particle diameter.

Furthermore, regarding the relative permittivity of the dielectric particles 23, particles of the same material are molded into pellets and sintered at a temperature of about 1000° C. to obtain a bulk material, and the dielectric constant thereof can be calculated. In addition, the dielectric constant can also be calculated by dispersing a predetermined amount of the particles in a binder or oil of known dielectric constant, measuring the dielectric constant of the dispersoid, and performing a calculation using the Maxwell-Wagner-Hanai expression.

In addition, the dielectric particles 23 in the piezoelectric layer 12 may be dispersed in the viscoelastic matrix 24 with regularity or irregularly as long as the dielectric particles 23 are uniformly dispersed.

In the transduction film 10, a quantitative ratio of the dielectric particles 23 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the dielectric particles 23 in the piezoelectric layer 12 with respect to the total volume of the viscoelastic matrix 24 and the dielectric particles 23, that is, the volume of the composite binder 22, is preferably 5% to 45%, more preferably 10% to 30%, and particularly preferably 20% to 30%.

By setting the volume fraction of the dielectric particles 23 in the composite binder 22 to be in the range described above, it is possible to obtain a preferred result from a viewpoint of making high piezoelectric properties and flexibility compatible.

The piezoelectric body particles 26 are formed of ceramics particles having a perovskite type or wurtzite type crystal structure.

As the ceramics particles configuring the piezoelectric body particles 26, for example, PZT (lead zirconate titanate)-based materials, BT: $BaTiO_3$ (barium titanate), BF: $BiFeO_3$, LN: $LiNbO_3$, NN: $NaNbO_3$, KN: $KNbO_3$, NBT: $(Na_{1/2},Bi_{1/2})TiO_3$, quartz crystal: $SiO_2$, aluminum nitride: AlN, zinc oxide: ZnO, tungsten bronze: $(Sr,Ca)_2NaNb_5O_{15}$, and the like are exemplified, and a solid solution thereof, for example, BFBT (BF+BT), KNN (KN+NN), NBT-BT, and the like are exemplified. In order to improve the properties, a material which has the above-mentioned structure as the skeleton is partially replaced with another element may be exemplified.

Among them, PZT-based materials high piezoelectric performance are preferable.

Here, the PZT-based material has $Pb(Zr_{1-x},Ti_x)O_3$ ($0.1 \leq x \leq 1$) as the skeleton structure.

Furthermore, in order to adjust the performance, other trace elements may be contained in the PZT-based material. For example, although not limited to the elements listed here, as doping elements for improving properties, so-called donor elements such as Nb, Ta, La, Bi, and Sb, so-called acceptor elements such as Mn, Ni, Zn, Mg, and Co, and the like are exemplified.

Further, for example, so-called relaxor dielectrics including PNN: $Pb(Ni_{1/3},Nb_{2/3})O_3$, PZN: $Pb(Zn_{1/3},Nb_{2/3})O_3$, PMN: $Pb(Mg_{1/3},Nb_{2/3})O_3$, PCoN: $Pb(Co_{1/3},Nb_{2/3})O_3$, PSN: $Pb(Sc_{1/2},Nb_{2/3})O_3$, and relaxor-based ferroelectrics in which PZT is solutionized can be used.

For example, PNN-PZT, PZN-PZT, PMN-PZT, and the like are exemplified. A relaxor-based ferroelectric system such as PNN-PZN-PZT in which a plurality of relaxor dielectrics are mixed may also be used. Also, a relaxor-based ferroelectric in which Zr is not contained, such as PZN-PT and PMN-PT can also be used.

Among these PZT-based materials, so-called intrinsic PZT: $Pb(Zr_{1-x},Ti_x)O_3$ ($0.1 \leq x \leq 1$) to which a doping element is not added is preferable due to its low dielectric constant and high piezoelectric constant.

Here, x is not particularly limited as long as piezoelectric properties are exhibited, but a range of, for example, $0.3 \leq x \leq 0.7$ is preferably used as a range with high piezoelectric properties.

The average particle diameter of the piezoelectric body particles 26 is more than or equal to 2.5 µm, more preferably set to 2.5 µm to 20 µm, and particularly preferably set to 2.5 µm to 10 µm.

By setting the particle diameter of the piezoelectric body particles 26 to be in the range described above, a preferred result is able to be obtained from a viewpoint of making high conversion efficiency (piezoelectric properties) and flexibility compatible.

As in the case of the dielectric particles described above, the average particle diameter of the piezoelectric body particles 26 means the average value of particle diameters calculated using a scanning electron microscope.

It is also preferable that the particle diameter distribution of the particle diameters of the piezoelectric body particles 26 satisfies a distribution that falls within a range of ±50% of the average particle diameter.

Note that the piezoelectric body particles 26 in the piezoelectric layer 12 may be dispersed with regularity or may be dispersed irregularly as long as the piezoelectric body particles 26 are uniformly dispersed in the viscoelastic matrix 24.

In the transduction film 10, a quantitative ratio of the piezoelectric body particles 26 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the piezoelectric body particles 26 in the piezoelectric layer 12 with respect to the total volume of the composite binder 22 and the piezoelectric body particles 26 is preferably 30% to 70%, particularly preferably greater than or equal to 50%. Therefore, the volume fraction thereof is more preferably 50% to 70%.

By setting the volume fraction of the piezoelectric body particles 26 in the piezoelectric layer 12 to be in the range described above, it is possible to obtain a preferred result from a viewpoint of making high piezoelectric properties and flexibility compatible.

In addition, in the transduction film 10, the thickness of the piezoelectric layer 12 is also not particularly limited, and may be appropriately set according to the size of the transduction film 10, the usage of the transduction film 10, properties required for the transduction film 10, and the like.

Here, according to the consideration of the present inventors, by reducing the thickness of the piezoelectric layer 12, the degree of bending due to its own weight can be reduced, and by reducing the weight, the followability of the piezoelectric film to the applied voltage is improved, thereby improving the sound pressure or acoustic quality. In addition, flexibility can be imparted thereto. On the other hand, if the piezoelectric layer 12 is too thin, when a voltage is continuously applied or a high voltage is applied, that a local short-circuit may occur regarding rigidity. Furthermore, the rigidity may decrease.

From the above viewpoint, the thickness of the piezoelectric layer 12 is preferably 5 µm to 100 µm, more preferably 8 µm to 50 µm, and even more particularly preferably 10 to 40 µm.

Furthermore, as described above, it is preferable that the piezoelectric layer 12 is subjected to polarization processing (poling). The polarization processing will be described below in detail.

As illustrated in FIG. 1, the transduction film 10 of the present invention has a configuration in which the lower thin film electrode 14 is formed on one surface of the piezoelectric layer 12, the lower protective layer 18 is formed thereon, the upper thin film electrode 16 is formed on the other surface of the piezoelectric layer 12, and the upper protective layer 20 is formed thereon. Here, the upper thin film electrode 16 and the lower thin film electrode 14 form an electrode pair.

In addition to these layers, the transduction film 10 may further include, for example, an electrode lead-out portion that leads out the electrodes from the upper thin film electrode 16 and the lower thin film electrode 14, and an insulating layer which covers a region where the piezoelectric layer 12 is exposed for preventing a short circuit or the like.

That is, the transduction film 10 has a configuration in which both surfaces of the piezoelectric layer 12 are interposed between the electrode pair, that is, the upper thin film electrode 16 and the lower thin film electrode 14 and this laminated body is interposed between the upper protective layer 20 and the lower protective layer 18. The region interposed between the upper thin film electrode 16 and the lower thin film electrode 14 as described above is driven according to an applied voltage.

In the transduction film 10, the upper protective layer 20 and the lower protective layer 18 have a function of applying appropriate rigidity and mechanical strength to the piezoelectric layer 12. That is, there may be a case where, in the transduction film 10 of the present invention, the piezoelectric layer 12 consisting of the composite binder 22 including the viscoelastic matrix 24 and the dielectric particles 23 and the piezoelectric body particles 26 exhibits extremely superior flexibility under bending deformation at a slow vibration but has insufficient rigidity or mechanical strength depending on the usage. As a compensation for this, the transduction film 10 is provided with the upper protective layer 20 and the lower protective layer 18.

The upper protective layer 20 and the lower protective layer 18 are not particularly limited, and may use various sheet-like materials. As an example, various resin films are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyamide (PA), polyethylene naphthalate (PEN), triacetylcellulose (TAC), and a cyclic olefin-based resin are suitably used. In addition, such protective layers may also be colored.

The thicknesses of the upper protective layer 20 and the lower protective layer 18 are not particularly limited. In addition, the thicknesses of the upper protective layer 20 and the lower protective layer 18 may basically be identical to each other or different from each other.

Here, when the rigidity of the upper protective layer 20 and the lower protective layer 18 excessively increases, not only is the stretching and contracting of the piezoelectric layer 12 constrained, but also the flexibility is impaired, and thus it is advantageous when the thicknesses of the upper protective layer 20 and the lower protective layer 18 become thinner unless mechanical strength or excellent handling ability as a sheet-like material is required.

According to the consideration of the present inventors, when the thickness of each of the upper protective layer 20 and the lower protective layer 18 is less than or equal to twice the thickness of the piezoelectric layer 12, it is possible to obtain a preferred result from a viewpoint of compatibility between ensuring the rigidity and appropriate flexibility, or the like.

For example, in a case where the thickness of the piezoelectric layer 12 is 20 µm and the upper protective layer 20 and the lower protective layer 18 are formed of PET, the thickness of each of the upper protective layer 20 and the lower protective layer 18 is preferably less than or equal to 40 µm, more preferably less than or equal to 20 µm, and particularly preferably less than or equal to 15 µm.

In the transduction film 10, the upper thin film electrode (hereinafter, also referred to as an upper electrode) 16 is formed between the piezoelectric layer 12 and the upper protective layer 20, and the lower thin film electrode (hereinafter, also referred to as a lower electrode) 14 is formed between the piezoelectric layer 12 and the lower protective layer 18.

The upper electrode 16 and the lower electrode 14 are provided to apply an electric field to the transduction film 10 (the piezoelectric layer 12).

In the present invention, a forming material of the upper electrode 16 and the lower electrode 14 is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, PEDOT/PPS (polyethylenedioxythiophene polystyrene sulfonate), and the like are exemplified. Among them, any one of copper, aluminum, gold, silver, platinum, and indium-tin oxide is suitably exemplified.

In addition, a forming method of the upper electrode 16 and the lower electrode 14 is not particularly limited, and as the forming method, various known methods such as a vapor-phase deposition method (a vacuum film forming method) such as vacuum vapor deposition or sputtering, film formation using plating, a method of adhering a foil formed of the materials described above, and a coating method, are able to be used.

Among them, in particular, by the reason that the flexibility of the transduction film 10 is able to be ensured, a copper or aluminum thin film formed by using the vacuum vapor deposition is suitably used as the upper electrode 16 and the lower electrode 14. Among them, in particular, the copper thin film formed by using the vacuum vapor deposition is suitably used.

The thicknesses of the upper electrode 16 and the lower electrode 14 are not particularly limited. In addition, the thicknesses of the upper electrode 16 and the lower electrode 14 may basically be identical to each other or different from each other.

Here, like the upper protective layer 20 and the lower protective layer 18 described above, when the rigidity of the upper electrode 16 and the lower electrode 14 excessively increases, not only is stretching and contracting of the piezoelectric layer 12 constrained, but also flexibility is impaired. For this reason, when the upper electrode 16 and the lower electrode 14 are in a range where electrical resistance does not excessively increase, it is advantageous when the thickness becomes thinner.

In addition, according to the consideration of the present inventors, when the product of the thicknesses of the upper electrode 16 and the lower electrode 14 and the Young's modulus is less than the product of the thicknesses of the upper protective layer 20 and the lower protective layer 18 and the Young's modulus, the flexibility is not considerably impaired, which is suitable.

For example, in a case of a combination of the upper protective layer 20 and the lower protective layer 18 formed of PET (Young's modulus: approximately 6.2 GPa) and the upper electrode 16 and the lower electrode 14 formed of copper (Young's modulus: approximately 130 GPa), when the thickness of the upper protective layer 20 and the lower protective layer 18 are 25 µm, the thickness of the upper electrode 16 and the lower electrode 14 are preferably less than or equal to 1.2 µm, more preferably less than or equal to 0.3 µm, and particularly preferably less than or equal to 0.1 µm.

In addition, the lower thin film electrode 14 and/or the upper thin film electrode 16 are not necessarily formed to correspond to the entire surface of the piezoelectric layer 12 (the lower protective layer 18 and/or the upper protective layer 20).

That is, at least one of the lower thin film electrode 14 and the upper thin film electrode 16 may be configured to be smaller than, for example, the piezoelectric layer 12, and the piezoelectric layer 12 and the protective layer may be configured to be in direct contact with each other in the peripheral portion of the transduction film 10.

Alternatively, the lower protective layer 18 and/or the upper protective layer 20 where the lower thin film electrode 14 and/or the upper thin film electrode 16 is formed on the entire surface are not necessarily formed to correspond to the entire surface of the piezoelectric layer 12. In this case, a second protective layer which comes into direct contact with the piezoelectric layer 12 may be configured to be separately provided on the surface side of the lower protective layer 18 and/or the upper protective layer 20.

Furthermore, a coating layer may be further provided for the purpose of improving the adhesion between the upper thin film electrode 16 and the piezoelectric layer 12, improving flexibility, and the like. In this case, the coating layer may be applied either onto the upper thin film electrode 16 or onto the piezoelectric layer 12.

In this case, as a polymer component, thermoplastic resins such as polymethacrylate, polyurethane, a polyester polyolefin, PVA, and polystyrene, and thermosetting resins such as a phenol resin and a melamine resin can be used. Among them, a dielectric polymer is preferably used in order to improve the acoustic performance. Specifically, the above-mentioned polymers and the like can be preferably used. Besides the polymer component, high dielectric particles, an antistatic agent, a surfactant, a thickener, a crosslinking agent, and the like may be added.

As described above, the transduction film 10 has a configuration in which the piezoelectric layer 12 in which the dielectric particles 23 and the piezoelectric body particles 26 are dispersed in the viscoelastic matrix 24 having a cyanoethyl group is interposed between the upper electrode 16 and the lower electrode 14, and this laminated body is interposed between the upper protective layer 20 and the lower protective layer 18.

In the transduction film 10, it is preferable that the local maximum value in which the loss tangent (Tanδ) at a frequency of 1 Hz according to the dynamic viscoelasticity measurement is greater than or equal to 0.1 exists at a normal temperature.

Accordingly, even when the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the transduction film 10, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0E+05 to 1.0E+06) N/m at 50° C.

Accordingly, the transduction film 10 is able to have appropriate rigidity and mechanical strength within a range not impairing the flexibility and the acoustic properties of the transduction film 10.

Furthermore, in the transduction film 10, it is preferable that the loss tangent (Tanδ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time of when the lowest resonance frequency $f_0$ is changed according to the change in the curvature of the speaker.

Hereinafter, an example of a manufacturing method of the transduction film 10 will be described with reference to FIGS. 2A to 2E.

Figure 2A:
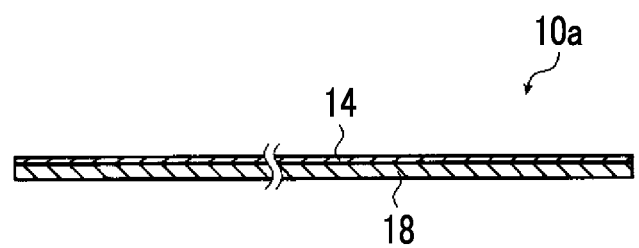
FIG. 2A is a conceptual view for explaining an example of a manufacturing method of the electroacoustic transduction film.

First, as illustrated in FIG. 2A, a sheet-like material 10a is prepared in which the lower electrode 14 is formed on the lower protective layer 18. The sheet-like material 10a may be prepared by forming a copper thin film or the like as the lower electrode 14 on the surface of the lower protective layer 18 using vacuum vapor deposition, sputtering, plating, and the like.

When the lower protective layer 18 is extremely thin, and thus the handling ability is degraded, the lower protective layer 18 with a separator (temporary supporter) may be used as necessary. As the separator, a PET film having a thickness of approximately 25 to 100 μm, and the like are able to be used. The separator may be removed after thermal compression bonding of the thin film electrode and the protective layer immediately before forming a side surface insulating layer, a second protective layer, and the like.

Alternatively, a commercially available product in which a copper thin film or the like is formed on the lower protective layer 18 may also be used as the sheet-like material 10a.

On the other hand, a coating material is prepared by dissolving a polymer material (hereinafter, also referred to as a viscoelastic material) having a cyanoethyl group, such as cyanoethylated PVA, in an organic solvent, further adding the dielectric particles 23 such as $BaTiO_3$ particles and the piezoelectric body particles 26 such as PZT particles thereto, and stirring and dispersing the resultant. The organic solvent is not particularly limited, and as the organic solvent, various organic solvents such as dimethylformamide (DMF), methyl ethyl ketone, and cyclohexanone are able to be used.

When the sheet-like material 10a described above is prepared and the coating material is prepared, the coating material is cast (applied) onto the surface of the sheet-like material, and the organic solvent is evaporated and dried. Accordingly, as illustrated in FIG. 2B, a laminated body 10b in which the lower electrode 14 is provided on the lower protective layer 18 and the piezoelectric layer 12 is formed on the lower electrode 14 is prepared.

A casting method of the coating material is not particularly limited, and as the casting method, all known methods (coating devices) such as a slide coater or a doctor blade are able to be used.

Figure 2B:
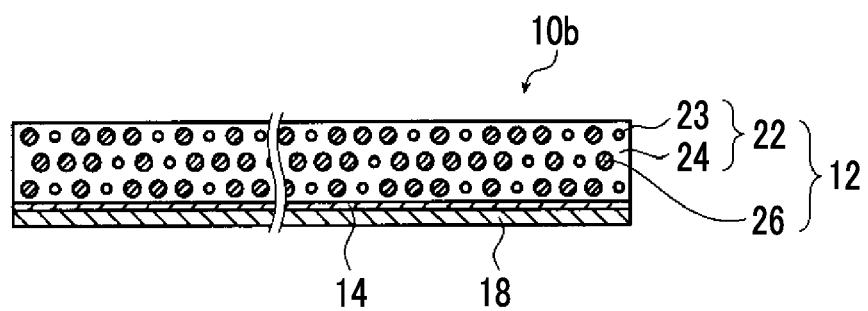
FIG. 2B is a conceptual view for explaining the example of the manufacturing method of the electroacoustic transduction film.

Alternatively, when the viscoelastic material is a material that is able to be heated and melted like cyanoethylated PVA, a melted material is prepared by heating and melting the viscoelastic material and adding and dispersing the dielectric particles 23 and the piezoelectric body particles 26 therein, is extruded into a sheet shape on the sheet-like material 10a illustrated in FIG. 2A by extrusion molding or the like, and is cooled, thereby preparing the laminated body 10b in which the lower electrode 14 is provided on the lower protective layer 18 and the piezoelectric layer 12 is formed on the lower electrode 14 as illustrated in FIG. 2B.

A preparation method of the coating material to be the piezoelectric layer 12 is also not particularly limited. The coating material may also be prepared by dissolving a polymer material having a cyanoethyl group, adding the dielectric particles 23 thereto, stirring the resultant, further adding the piezoelectric body particles 26 thereto, and stirring the resultant.

In addition, as described above, in the transduction film 10, in addition to the viscoelastic material such as cyanoethylated PVA, a polymer piezoelectric material such as PVDF may be added to the viscoelastic matrix 24.

When the polymer piezoelectric material is added to the viscoelastic matrix 24, the polymer piezoelectric material added to the coating material may be dissolved. Alternatively, the polymer piezoelectric material to be added may be added to the heated and melted viscoelastic material and may be heated and melted.

When the laminated body 10b in which the lower electrode 14 is provided on the lower protective layer 18 and the piezoelectric layer 12 is formed on the lower electrode 14, is prepared, it is preferable that the piezoelectric layer 12 is subjected to polarization processing (poling).

A polarization processing method of the piezoelectric layer 12 is not particularly limited, and as the polarization processing method, a known method is able to be used. As a preferred polarization processing method, a method illustrated in FIGS. 2C and 2D is exemplified.

Figure 2C:
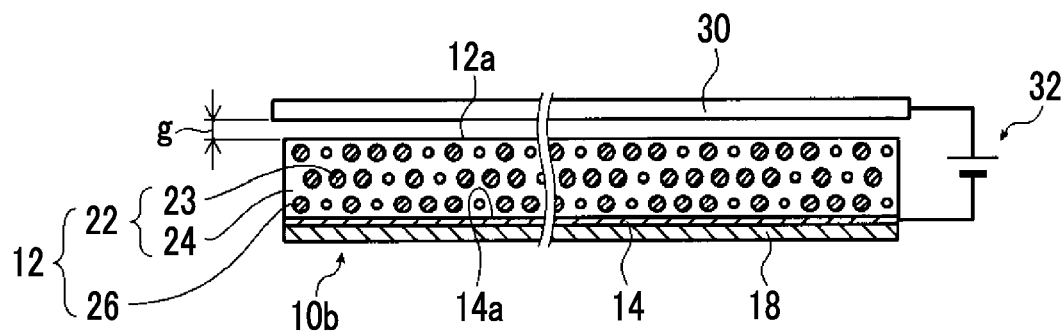
FIG. 2C is a conceptual view for explaining the example of the manufacturing method of the electroacoustic transduction film.
Figure 2D:
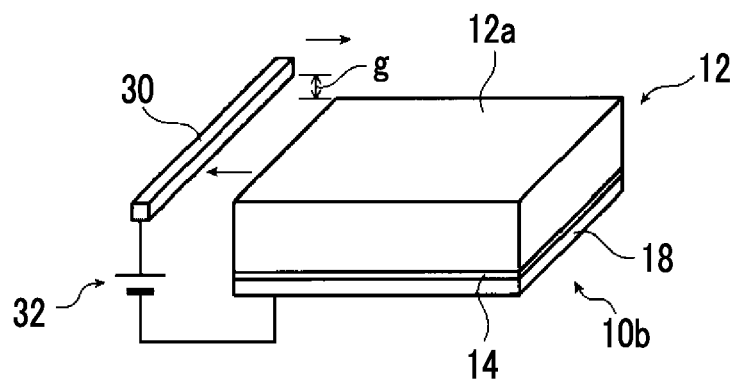
FIG. 2D is a conceptual view for explaining the example of the manufacturing method of the electroacoustic transduction film.

In this method, as illustrated in FIGS. 2C and 2D, for example, a gap g of 1 mm is opened on an upper surface 12a of the piezoelectric layer 12 of the laminated body 10b, and a rod-like or wire-like corona electrode 30 which is able to be moved along the upper surface 12a is disposed. Then, the corona electrode 30 and the lower electrode 14 are connected to a direct-current power source 32.

Furthermore, heating means for heating and holding the laminated body 10b, for example, a hot plate, is prepared.

Then, in a state where the piezoelectric layer 12 is heated and held by the heating means, for example, at a temperature of 100° C., a direct-current voltage of a few kV, for example, 6 kV, is applied between the lower electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the polarization processing.

During the polarization processing using the corona discharge (hereinafter, for convenience, also referred to as corona poling processing), known rod-like moving means may be used to move the corona electrode 30.

In addition, in the corona poling processing, a method of moving the corona electrode 30 is not limited. That is, the corona electrode 30 is fixed, a moving mechanism for moving the laminated body 10b is provided, and the polarization processing may be performed by moving the laminated body 10b. Moving means for a known sheet-like material may be used to move the laminated body 10b.

Furthermore, the number of corona electrodes 30 is not limited to one, and the corona poling processing may be performed by using a plurality of lines of corona electrodes 30.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper electrode 16 is formed before the polarization processing.

Before the polarization processing, calender processing may be performed to smoothen the surface of the piezoelectric layer 12 using a heating roller or the like. By performing the calender processing, a thermal compression bonding process described below is able to be smoothly performed.

In this way, while the piezoelectric layer 12 of the laminated body 10b is subjected to the polarization processing, a sheet-like material 10c is prepared in which the upper electrode 16 is formed on the upper protective layer 20. This sheet-like material 10c may be prepared by forming a copper thin film or the like as the upper electrode 16 on the surface of the upper protective layer 20 using vacuum vapor deposition, sputtering, plating, and the like.

Figure 2E:
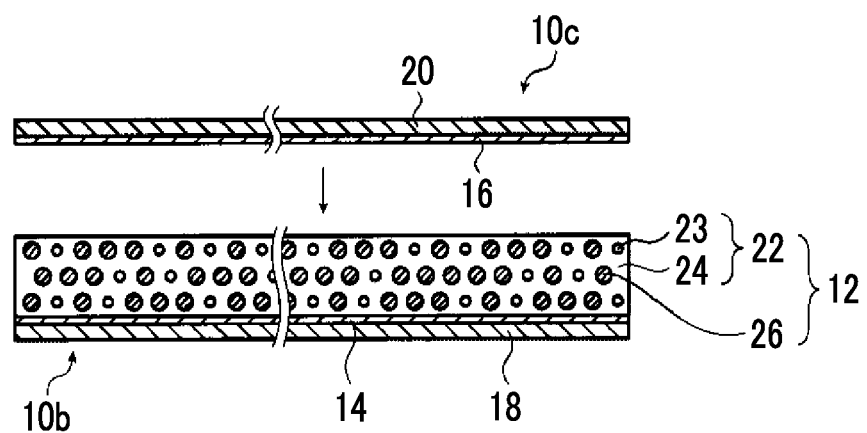
FIG. 2E is a conceptual view for explaining the example of the manufacturing method of the electroacoustic transduction film.

Next, as illustrated in FIG. 2E, the sheet-like material 10c is laminated on the laminated body 10b in which the piezoelectric layer 12 is subjected to the polarization processing while the upper electrode 16 faces the piezoelectric layer 12.

Furthermore, a laminated body of the laminated body 10b and the sheet-like material 10c is interposed between the upper protective layer 20 and the lower protective layer 18, and is subjected to the thermal compression bonding using a heating press device, a heating roller pair, or the like such that the transduction film 10 is prepared.

The transduction film 10 may be manufactured by using the above-mentioned sheet-like material in the form of a cut sheet, or may be manufactured by roll-to-roll (hereinafter, also referred to as RtoR).

As is well known, RtoR is a manufacturing method of drawing, from a roll formed by winding a long raw material, the raw material, performing various treatments such as film formation and surface treatment while transporting the raw material in the longitudinal direction, and winding the treated raw material into a roll shape.

Here, a method in a case of measuring the material, average particle diameter, and volume fraction of each of the piezoelectric body particles 26 and the dielectric particles 23 in the piezoelectric layer 12 from the manufactured transduction film 10 will be described.

First, as a method of specifying the material of the particles dispersed in the piezoelectric layer, a method of cutting a portion of the piezoelectric layer 12 as a sample or peeling off the thin film electrode and the protective layer to extract the piezoelectric layer 12, dissolving the viscoelastic matrix 24 of the piezoelectric layer 12 using a solvent such as DMF, separating powder in which the piezoelectric body particles 26 and the dielectric particles 23 are mixed, and specifying the materials of the piezoelectric body particles 26 and the dielectric particles 23 by performing elemental analysis on the powder using XPS (X-ray photoelectron spectrometer) is exemplified. Alternatively, the materials of the particles can be obtained by a method of taking a cross section of the transduction film 10 (the piezoelectric layer 12) and performing elemental analysis on the cross section using XPS or the like.

As the solvent, various solvents can be used as long as the solvents dissolve the viscoelastic matrix 24 and do not dissolve the piezoelectric body particles 26 and the dielectric particles 23.

Next, as a method of measuring the average particle diameter of each of the piezoelectric body particles 26 and the dielectric particles 23 in the piezoelectric layer 12, a method of preparing a cross section of the piezoelectric layer by microtome cutting, performing elemental mapping on each of the particles using a scanning electron microscope (SEM) energy dispersive X-ray spectrometer (EDX), and obtaining the major axis thereof is exemplified.

As a method of measuring the volume fraction of each of the piezoelectric body particles 26 and the dielectric particles 23 in the piezoelectric layer 12, a method of preparing a cross section of the piezoelectric layer by microtome cutting, performing elemental mapping on each of the particles using a scanning electron microscope (SEM) energy dispersive X-ray spectrometer (EDX), and obtaining the area thereof so as to be regarded as the volume fraction is exemplified.

Next, an electroacoustic transducer using the transduction film as a vibration plate will be described.

Figure 3A:
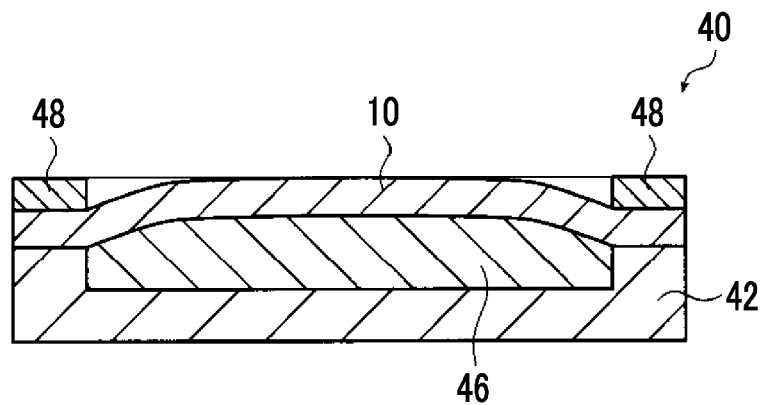
FIG. 3A is a sectional view schematically illustrating an example of an electroacoustic transducer of the present invention.
Figure 3B:
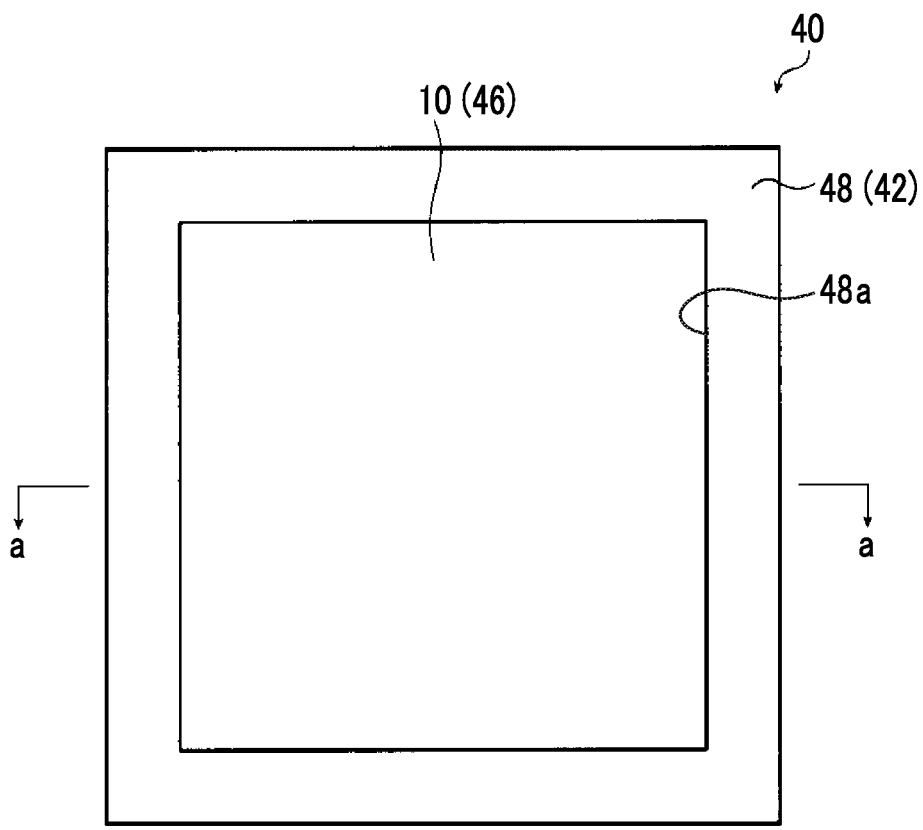
FIG. 3B is a plan view of FIG. 3A.

FIG. 3A is a sectional view schematically illustrating an example of the electroacoustic transducer of the present invention, and FIG. 3B is a plan view of FIG. 3A.

An electroacoustic transducer 40 illustrated in FIGS. 3A and 3B uses the transduction film 10 as a vibration plate.

As illustrated in the figure, the electroacoustic transducer 40 is a flat type speaker, and the vertical direction in FIG. 3A is the vibration direction of the transduction film 10, that is, the radiation direction of a sound. FIG. 3B is a view as seen from the vibration direction of the transduction film 10, and FIG. 3A is a sectional view taken along the line a-a in FIG. 3B.

The electroacoustic transducer 40 is configured to include the transduction film 10, a case 42, a viscoelastic supporter 46, and a frame 48.

The case 42 is a holding member that holds the transduction film 10 and the viscoelastic supporter 46 together with the frame 48. The case 42 is a thin housing formed of plastic or the like in a square tubular shape in which one surface is open. The case 42 accommodates the viscoelastic supporter 46 therein.

In the electroacoustic transducer of the present invention, the shape of the case 42 (that is, the shape of the electroacoustic transducer) is not limited to the square tubular shape, and a housing having various shapes such as a cylindrical shape and a rectangular tubular shape having a rectangular bottom surface is able to be used.

The frame 48 is a member for supporting the transduction film 10 in a state of being stretched over the open surface of the case 42. The frame 48 is a square plate-like member formed of metal, plastic, or the like with an opening 48a at the center. The frame 48 has the same shape as the open surface of the case 42, and the shape of the opening 48a is the same shape as the open portion of the case 42.

Furthermore, the viscoelastic supporter 46 has moderate viscosity and elasticity, supports the transduction film 10, and applies a constant mechanical bias to any place of the transduction film 10 so as to efficiently convert the stretching and contracting movement of the transduction film 10 into a forward and rearward movement (a movement in a direction perpendicular to the surface of a transduction film).

In the illustrated example, the viscoelastic supporter 46 has a quadrangular prism shape having a bottom shape substantially equal to the bottom surface of the case 42. In addition, the height of the viscoelastic supporter 46 is larger than the depth of the case 42.

The material of the viscoelastic supporter 46 is not particularly limited as long as the material has moderate viscosity and elasticity and suitably deforms without impeding the vibration of the piezoelectric film. As an example, wool felt, nonwoven fabric of wool felt including rayon or PET, a foamed material (foamed plastic) such as glass wool or polyurethane, a laminate of a plurality of sheets of paper, a coating material, and the like are exemplified.

The specific gravity of the viscoelastic supporter 46 is not particularly limited and may be appropriately selected according to the type of the viscoelastic supporter. As an example, in a case where felt is used as the viscoelastic supporter, the specific gravity thereof is preferably 50 to 500 $kg/m^3$, and more preferably 100 to 300 $kg/m^3$. In a case where glass wool is used as the viscoelastic supporter, the specific gravity thereof is preferably 10 to 100 $kg/m^3$.

The electroacoustic transducer 40 is configured by accommodating the viscoelastic supporter 46 in the case 42, covering the case 42 and the viscoelastic supporter 46 with the transduction film 10, and fixing the frame 48 to the case 42 in a state in which the periphery of the transduction film 10 is brought into contact with the open surface of the case 42 by the frame 48.

A method of fixing the frame 48 to the case 42 is not particularly limited, and various known methods such as a method using screws, bolts and nuts and a method using a fixing jig are able to be used.

Figure 3C:
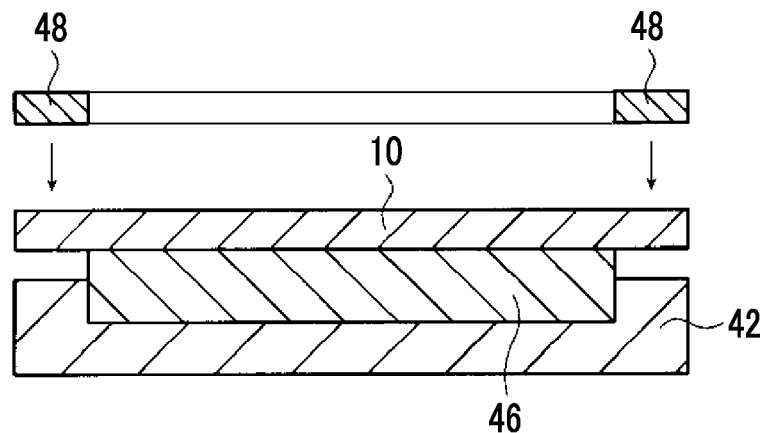
FIG. 3C is a sectional view for explaining the configuration of the electroacoustic transducer.

In the electroacoustic transducer 40, the height (thickness) of the viscoelastic supporter 46 is greater than the height of the inner surface of the case 42. That is, as illustrated in FIG. 3C, in a state before the transduction film 10 and the frame 48 are fixed, the viscoelastic supporter 46 is in a state protruding from the upper surface of the case 42.

Therefore, in the electroacoustic transducer 40, the viscoelastic supporter 46 is held in a state in which the viscoelastic supporter 46 is pressed downward by the transduction film 10 and decreases in thickness toward the peripheral portion of the viscoelastic supporter 46. That is, the principal surface of the transduction film 10 is held in a bent state.

At this time, it is preferable that the entire surface of the viscoelastic supporter 46 is pressed in the surface direction of the transduction film 10 so that the thickness decreases over the entire surface. That is, it is preferable that the entire surface of the transduction film 10 is pressed and supported by the viscoelastic supporter 46.

In addition, in the electroacoustic transducer 40, the viscoelastic supporter 46 is in a state of being compressed more in the thickness direction as it approaches the frame 48. However, due to the static viscoelastic effect (stress relaxation), a constant mechanical bias can be maintained at any place of the transduction film 10. Accordingly, the stretching and contracting movement of the transduction film 10 is efficiently converted into a forward and rearward movement, so that it is possible to obtain a flat electroacoustic transducer 40 that is thin, achieves a sufficient sound volume, and has excellent acoustic properties.

In the electroacoustic transducer 40 having such a configuration, a region of the transduction film 10 corresponding to the opening 48a of the frame 48 serves as a vibration surface. That is, the frame 48 is a portion that defines the vibration surface.

Here, in the electroacoustic transducer 40 illustrated in FIG. 3A, the entire peripheral area of the transduction film 10 is pressed against the case 42 by the frame 48, but the present invention is not limited thereto.

That is, the electroacoustic transducer using the transduction film 10 is also able to use a configuration in which the transduction film 10 is pressed against and fixed to the surface of the case 42 by screws, bolt nuts, holding devices, or the like, for example, at the four corners of the case 42 without using the frame 48.

An O-ring or the like may be interposed between the case 42 and the transduction film 10. With this configuration, a damper effect is able to be achieved, and it is possible to prevent the vibration of the transduction film 10 from being transmitted to the case 42, and to obtain excellent acoustic properties.

In addition, the electroacoustic transducer using the transduction film 10 may not have the case 42 that accommodates the viscoelastic supporter 46.

Figure 4:
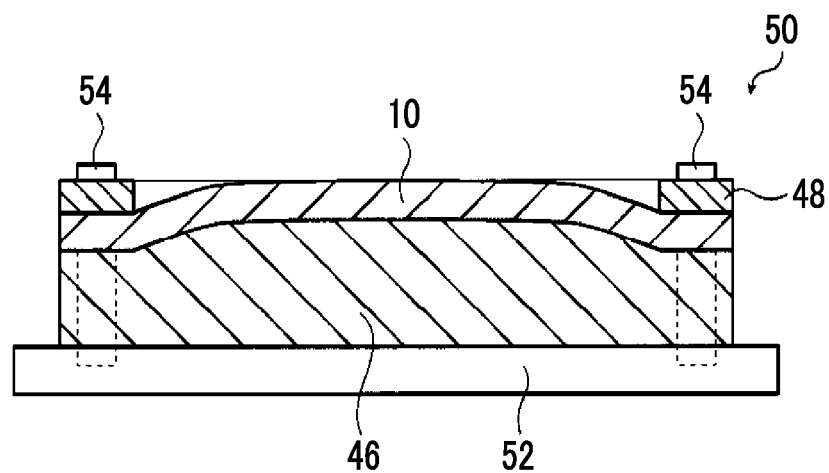
FIG. 4 is a sectional view schematically illustrating another example of the electroacoustic transducer of the present invention.

That is, for example, as conceptually illustrated by a sectional view of an electroacoustic transducer 50 in FIG. 4, the viscoelastic supporter 46 is placed on a support plate 52 having rigidity, the transduction film 10 is placed to cover the viscoelastic supporter 46, the same frame 48 as described above is placed on the peripheral portion thereof. Next, a configuration in which the frame 48 is fixed to the support plate 52 by screws 54 or the like to press the viscoelastic supporter 46 together with the frame 48 is also able to be used.

The size of the support plate 52 may be greater than the viscoelastic supporter 46. Furthermore, by using various vibration plates formed of polystyrene, foamed PET, or carbon fiber as the material of the support plate 52, an effect of further amplifying the vibration of the electroacoustic transducer can be expected.

Moreover, the electroacoustic transducer is not limited to the configuration that presses the periphery, and for example, a configuration in which the center of the laminated body of the viscoelastic supporter 46 and the transduction film 10 is pressed by some means is also able to be used.

That is, various configurations are able to be used by the electroacoustic transducer as long as the transduction film 10 is held in a bent state.

Alternatively, a configuration in which a resin film is attached to the transduction film 10 to apply a tension thereto may (bend) also be adopted. By configuring the transduction film 10 to be held with the resin film and causing the transduction film 10 to be held in a bent state, a flexible speaker is able to be obtained.

Alternatively, the transduction film 10 may be configured to be stretched over a bent frame.

In addition, in the electroacoustic transducer 40 illustrated in FIGS. 3A to 3C, the transduction film 10 is pressed by the viscoelastic supporter 46 and is held in a state in which the principal surface thereof is bent convexly. In this way, the configuration for holding the transduction film 10 in a bent state is not particularly limited.

Alternatively, the transduction film 10 itself may be formed into a convex shape. A forming, method of the convex portion is not particularly limited, and various known processing methods of resin films are able to be used. For example, the convex portion is able to be formed by a vacuum pressure molding method or a forming method such as embossing.

Alternatively, for example, a configuration in which an airtight case is used, the open end of the case is covered and closed by the transduction film, gas is introduced into the case to apply a pressure to the transduction film, and the transduction film is thus held in a convexly swollen state may be provided.

Figure 5A:
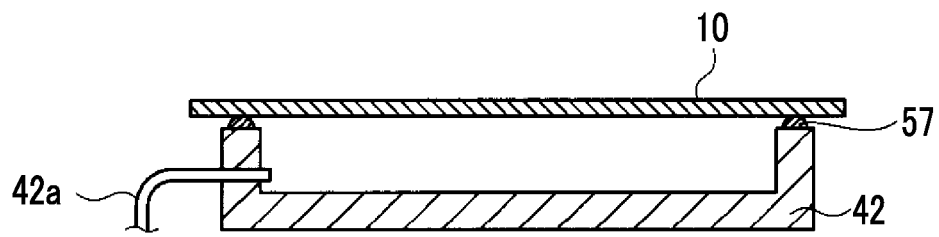
FIG. 5A is a sectional view for explaining another example of a structure of the present invention.
Figure 5B:
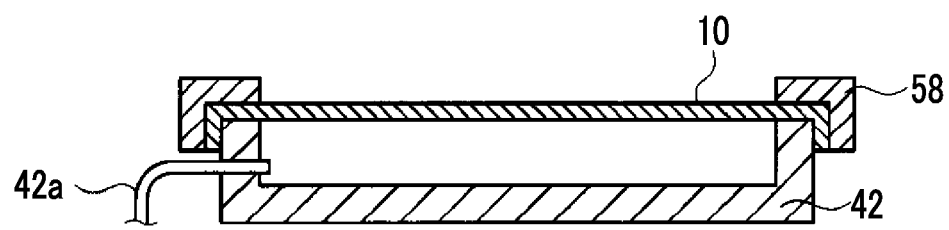
FIG. 5B is a sectional view for explaining another example of a structure of the present invention.
Figure 5C:
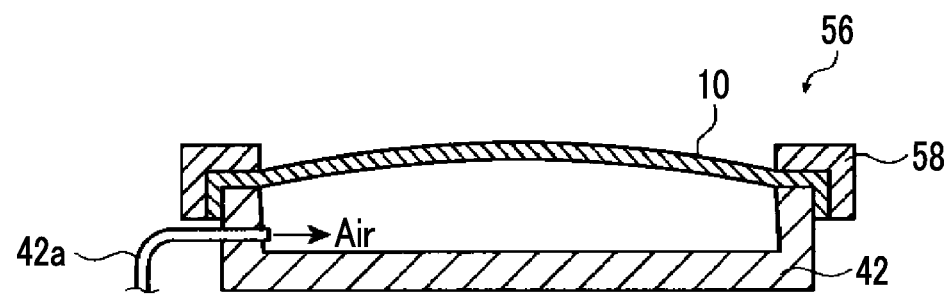
FIG. 5C is a sectional view for explaining another example of a structure of the present invention.

For example, an electroacoustic transducer 56 illustrated in FIG. 5C is exemplified.

First, as illustrated in FIG. 5A, the electroacoustic transducer 56 uses an object having airtightness as the same case 42 and is provided with a pipe 42*a* for introducing air into the case 42.

An O-ring 57 is provided on the upper surface of the end portion on the open side of the case 42 and is covered with the transduction film 10 to close the open surface of the case 42.

Next, as illustrated in FIG. 5B, a frame-shaped pressing lid 58 having an inner periphery substantially the same as the outer periphery of the case 42 and an approximately L-shaped cross section is fitted to the outer periphery of the case 42 (the O-ring 57 is omitted in FIGS. 5B and 5C).

Accordingly, the transduction film 10 is pressed against and fixed to the case 42 such that the inside of the case 42 is airtightly closed by the transduction film 10.

Furthermore, as illustrated in FIG. 5C, air is introduced from the pipe 42*a* into the case 42 (a closed space formed by the case 42 and the transduction film 10) to apply a pressure to the transduction film 10, and the transduction film 10 is thus held in a convexly swollen state, thereby forming the electroacoustic transducer 56.

The pressure in the case 42 is not limited, and may be the atmospheric pressure or higher such that the transduction film 10 is convexly swollen.

The pipe 42*a* may be fixed or detachable. When the pipe 42*a* is detached, it is natural that the detaching portion of the pipe is airtightly closed.

The electroacoustic transduction film of the present invention is able to be suitably used as a speaker by being assembled with a flexible display such as an organic EL display. Furthermore, the electroacoustic transduction film of the present invention is able to be suitably assembled with a screen for a projector.

With such a configuration, it is possible to improve the design properties and entertainment properties of the transduction film. Further, by integrating the transduction film as a speaker with a screen or a flexible display, it is possible to reproduce a sound in a direction in which an image is displayed, and to improve a sense of realism.

In addition, the screen for a projector is flexible and is thus able to be provided with a curvature. By causing an image display surface to be provided with a curvature, it is possible to make the distance from an observer to the screen substantially uniform between the center and the end portion of the screen, and it is possible to improve a sense of realism.

In the case where the image display surface is provided with curvature as described above, distortion occurs in the projected image. Therefore, it is preferable to perform image processing on the data of the projected image so as to reduce the distortion according to the curvature of the image display surface.

As described above, the polymer composite piezoelectric body, the electroacoustic transduction film, and the electroacoustic transducer of the present invention are described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention.

Example 1

According to the method illustrated in FIGS. 2A to 2E described above, the transduction film 10 illustrated in FIG. 1 was prepared.

First, cyanoethylated PVA (CR-V manufactured by Shin-Etsu Chemical Co., Ltd.) was dissolved in methyl ethyl ketone (MEK) at the following compositional ratio. Thereafter, barium titanate ($BaTiO_3$) as the dielectric particles and PZT particles as the piezoelectric body particles were added to this solution at the following compositional ratios, and were dispersed by using a propeller mixer (rotation speed 2000 rpm), and thus a coating material for forming the piezoelectric layer 12 was prepared.

| | |
|---|---|
| PZT Particles | 1000 parts by mass |
| $BaTiO_3$ particles | 90 parts by mass |
| Cyanoethylated PVA | 85 parts by mass |
| MEK | 567 parts by mass |

In addition, as the PZT particles, those obtained by sintering commercially available PZT raw material powder at 1000° C. to 1200° C. and thereafter crushing and classifying the resultant so as to have an average particle diameter of 3.4 μm were used.

As the $BaTiO_3$ particles, BT-05 (average particle diameter 0.5 μm manufactured by Sakai Chemical Industry Co., Ltd.) was used.

In addition, the relative permittivity of $BaTiO_3$ is 3,000 at 25° C.

As a result of calculating the area ratio by the above-described SEM-EDX mapping of the cross section of the piezoelectric layer formed using this coating material, the volume fraction of the dielectric particles with respect to the total volume of cyanoethylated PVA as the viscoelastic matrix and $BaTiO_3$ particles as the dielectric particles, that is, the composite binder was 15%, and the volume fraction of the viscoelastic matrix was 85%.

In addition, the volume fraction of the piezoelectric body particles with respect to the total volume of the composite binder and PZT as the piezoelectric body particles was 60%, and the volume fraction of the composite binder was 40%.

On the other hand, the sheet-like materials 10a and 10c were prepared in which a copper thin film having a thickness of 0.1 μm was vacuum vapor deposited on a PET film having a thickness of 4 μm. That is, in this example, the upper electrode 16 and the lower electrode 14 are copper vapor deposition thin films having a thickness of 0.1 m, and the upper protective layer 20 and the lower protective layer 18 are PET films having a thickness of 4 μm.

In order to obtain good handling ability during the process, as the PET film, a film with a separator (temporary supporter PET) having a thickness of 50 μm attached thereto was used, and the separator of each protective layer was removed after thermal compression bonding of the thin film electrode and the protective layer.

The coating material for forming the piezoelectric layer 12 prepared as described above was applied onto the lower electrode 14 of the sheet-like material 10a (the copper vapor deposition thin film) by using a slide coater. Furthermore, the coating material was applied such that the film thickness of the coating film after being dried was 40 μm.

Next, a material in which the coating material was applied onto the sheet-like material 10a was heated and dried in an oven at 120° C. such that MEK was evaporated. Accordingly, the laminated body 10b was prepared in which the lower electrode 14 made of copper was formed on the lower protective layer 18 made of PET, and the piezoelectric layer 12 (piezoelectric layer) having a thickness of 40 μm was formed thereon.

The piezoelectric layer 12 of the laminated body 10b was subjected to the polarization processing by the above-described corona poling illustrated in FIGS. 2C and 2D. Furthermore, the polarization processing was performed by setting, the temperature of the piezoelectric layer 12 to 100° C., and applying a direct-current voltage of 6 kV between the lower electrode 14 and the corona electrode 30 so as to cause corona discharge to occur.

The sheet-like material 10c was laminated on the laminated body 10b which was subjected to the polarization processing while the application surface of a film in which a mixture of cyanoethylated pullulan and cyanoethylated PVA (CR-M manufactured by Shin-Etsu Chemical Co., Ltd.) was applied onto the upper electrode 16 (copper thin film side) so as to have a thickness of 0.3 μm faced the piezoelectric layer 12.

Next, the laminated body of the laminated body 10b and the sheet-like material 10c was subjected to thermal compression bonding at 120° C. by using a laminator device, and thus the piezoelectric layer 12 adhered to the upper electrode 16 and the lower electrode 14 such that a flat piezoelectric film was prepared.

As illustrated in FIGS. 3A to 3C, the electroacoustic transducer 40 as a speaker was prepared by assembling the prepared transduction film 10 into the case 42. The case 42 is a box-shaped container having an open surface, and a plastic rectangular container having an open surface size of 172×302 mm and a depth of 9 mm, was used.

In addition, the viscoelastic supporter 46 was disposed in the case 42. The viscoelastic supporter 46 was made of glass wool having a height of 40 mm before assembly and a density of 16 $kg/m^3$.

The transduction film 10 was disposed so as to cover the viscoelastic supporter 46 and the opening of the case 42, the peripheral portion thereof was fixed by the frame 48 such that an appropriate tension and curvature were applied to the transduction film 10 by the viscoelastic supporter 46, thereby preparing the electroacoustic transducer 40. As a result, the transduction film 10 was bent into a convex shape like a convex lens.

Example 2

An electroacoustic transducer was prepared in the same manner as in Example 1 except that the thickness of the piezoelectric layer 12 was set to 25 μm.

Example 3

An electroacoustic transducer was prepared in the same manner as in Example 1 except that the thickness of the piezoelectric layer 12 was set to 20 μm.

Example 4

An electroacoustic transducer was prepared in the same manner as in Example 1 except that the thickness of the piezoelectric layer 12 was set to 15 μm.

Example 5

An electroacoustic transducer was prepared in the same manner as in Example 1 except that the thickness of the piezoelectric layer 12 was set to 10 μm.

Example 6

An electroacoustic transducer was prepared in the same manner as in Example 1 except that the thickness of the piezoelectric layer 12 was set to 8 μm.

Example 7

An electroacoustic transducer was prepared in the same manner as in Example 3 except that the volume fraction of the piezoelectric body particles in the piezoelectric layer was set to 40% by changing the compositional ratio of the PZT particles when the coating material for forming the piezoelectric layer was prepared.

Example 8

An electroacoustic transducer was prepared in the same manner as in Example 3 except that the volume fraction of the piezoelectric body particles was set to 50%.

Example 9

An electroacoustic transducer was prepared in the same manner as in Example 3 except that the volume fraction of the piezoelectric body particles was set to 70%.

Example 10

An electroacoustic transducer was prepared in the same manner as in Example 3 except that the volume fraction of the dielectric particles with respect to the total volume of the viscoelastic matrix and the dielectric particles was set to 5% by changing the compositional ratio of the BaTiO₃ particles when the coating material for forming the piezoelectric layer was prepared.

Example 11

An electroacoustic transducer was prepared in the same manner as in Example 3 except that the volume fraction of the dielectric particles was set to 10%.

Example 12

An electroacoustic transducer was prepared in the same manner as in Example 3 except that the volume fraction of the dielectric particles was set to 20%.

Example 13

An electroacoustic transducer was prepared in the same manner as in Example 3 except that the volume fraction of the dielectric particles was set to 30%.

Example 14

An electroacoustic transducer was prepared in the same manner as in Example 3 except that the volume fraction of the dielectric particles was set to 40%.

Example 15

An electroacoustic transducer was prepared in the same manner as in Example 3 except that the volume fraction of the dielectric particles was set to 60%.

Example 16

An electroacoustic transducer was prepared in the same manner as in Example 10 except that BT-01 (manufactured by Sakai Chemical Industry Co., Ltd.) having an average particle diameter of 0.1 µm was used as the BaTiO₃ particles as the dielectric particles.

Example 17

An electroacoustic transducer was prepared in the same manner as in Example 3 except that BT-01 (manufactured by Sakai Chemical Industry Co., Ltd.) having an average particle diameter of 0.1 µm was used as the BaTiO₃ particles as the dielectric particles.

Example 18

An electroacoustic transducer was prepared in the same manner as in Example 13 except that BT-01 (manufactured by Sakai Chemical Industry Co., Ltd.) having an average particle diameter of 0.1 µm was used as the BaTiO₃ particles as the dielectric particles.

Example 19

An electroacoustic transducer was prepared in the same manner as in Example 14 except that BT-01 (manufactured by Sakai Chemical Industry Co., Ltd.) having an average particle diameter of 0.1 µm was used as the BaTiO₃ particles as the dielectric particles.

Example 20

An electroacoustic transducer was prepared in the same manner as in Example 3 except that titanium oxide (TiO₂) was used as the dielectric particles.

In addition, the relative permittivity of TiO₂ particles is 83 at 25° C.

Example 21

An electroacoustic transducer was prepared in the same manner as in Example 3 except that strontium titanate (SrTiO₃) was used as the dielectric particles.

In addition, the relative permittivity of SrTiO₃ particles is 300 at 25° C.

Example 22

An electroacoustic transducer was prepared in the same manner as in Example 3 except that the average particle diameter of the piezoelectric body particles was set to 2.5 µm.

Example 23

An electroacoustic transducer was prepared in the same manner as in Example 3 except that the average particle diameter of the piezoelectric body particles was set to 10.0 µm.

Comparative Example 1

An electroacoustic transducer was prepared in the same manner as in Example 3 except that no dielectric particles were included.

Comparative Example 2

An electroacoustic transducer was prepared in the same manner as in Example 3 except that PZT particles crushed and classified to have an average particle diameter of 1.0 µm were used as the piezoelectric body particles.

Comparative Example 3

An electroacoustic transducer was prepared in the same manner as in Example 13 except that BaTiO₃ particles crushed and classified to have an average particle diameter of 1.0 µm were used as the dielectric particles.

Comparative Example 4

An electroacoustic transducer was prepared in the same manner as in Comparative Example 1 except that the volume fraction of the piezoelectric body particles in the piezoelectric layer was set to 66% by changing the compositional ratio of the PZT particles when the coating material for forming the piezoelectric layer was prepared.

Evaluation (Sound Pressure)

The sound pressure level of the prepared electroacoustic transducer was measured.

Specifically, a microphone was disposed at a position of 0.5 in away from the center of the piezoelectric film of the electroacoustic transducer, a $10V_{0\text{-}p}$ sine wave of 1 kHz was input between the upper electrode and the lower electrode of the electroacoustic transducer to measure the sound pressure level.

Based on the difference in sound pressure level from Comparative Example 1, evaluation was performed as follows.

A case where the difference in sound pressure level from Comparative Example 1 is more than or equal to +3 dB was evaluated as "A".

A case where the difference in sound pressure level from Comparative Example 1 is more than or equal to +2 dB and less than +3 dB was evaluated as "B".

A case where the difference in sound pressure level from Comparative Example 1 is more than or equal to +1 dB and less than +2 dB was evaluated as "C".

A case where the difference in sound pressure level from Comparative Example 1 is less than +1 dB was evaluated as "D".

The results are shown in Table 1.

TABLE 1

| | Polymer composite piezoelectric body | | | | | | | | | |
| | Composite binder | | | | | | Piezoelectric body particles | | | |
| | Polymer material | | Dielectric particles | | | | | | | |
| | Material | Volume fraction % | Particle kind | Relative permittivity | Particle diameter [μm] | Volume fraction % | Volume fraction % | Particle kind | Particle diameter [μm] | Volume fraction % | Film thickness [μm] | Evaluation Sound pressure |
|---|---|---|---|---|---|---|---|---|---|---|---|---|
| EXAMPLE 1 | Cyanoethylated PVA | 85 | BaTiO$_3$ | 3000 | 0.5 | 15 | 40 | PZT | 3.4 | 60 | 40 | B |
| EXAMPLE 2 | Cyanoethylated PVA | 85 | BaTiO$_3$ | 3000 | 0.5 | 15 | 40 | PZT | 3.4 | 60 | 25 | A |
| EXAMPLE 3 | Cyanoethylated PVA | 85 | BaTiO$_3$ | 3000 | 0.5 | 15 | 40 | PZT | 3.4 | 60 | 20 | A |
| EXAMPLE 4 | Cyanoethylated PVA | 85 | BaTiO$_3$ | 3000 | 0.5 | 15 | 40 | PZT | 3.4 | 60 | 15 | A |
| EXAMPLE 5 | Cyanoethylated PVA | 85 | BaTiO$_3$ | 3000 | 0.5 | 15 | 40 | PZT | 3.4 | 60 | 10 | B |
| EXAMPLE 6 | Cyanoethylated PVA | 85 | BaTiO$_3$ | 3000 | 0.5 | 15 | 40 | PZT | 3.4 | 60 | 8 | C |
| EXAMPLE 7 | Cyanoethylated PVA | 85 | BaTiO$_3$ | 3000 | 0.5 | 15 | 60 | PZT | 3.4 | 40 | 20 | B |
| EXAMPLE 8 | Cyanoethylated PVA | 85 | BaTiO$_3$ | 3000 | 0.5 | 15 | 50 | PZT | 3.4 | 50 | 20 | A |
| EXAMPLE 9 | Cyanoethylated PVA | 85 | BaTiO$_3$ | 3000 | 0.5 | 15 | 30 | PZT | 3.4 | 70 | 20 | A |
| EXAMPLE 10 | Cyanoethylated PVA | 95 | BaTiO$_3$ | 3000 | 0.5 | 5 | 40 | PZT | 3.4 | 60 | 20 | C |
| EXAMPLE 11 | Cyanoethylated PVA | 90 | BaTiO$_3$ | 3000 | 0.5 | 10 | 40 | PZT | 3.4 | 60 | 20 | B |
| EXAMPLE 12 | Cyanoethylated PVA | 80 | BaTiO$_3$ | 3000 | 0.5 | 20 | 40 | PZT | 3.4 | 60 | 20 | A |
| EXAMPLE 13 | Cyanoethylated PVA | 70 | BaTiO$_3$ | 3000 | 0.5 | 30 | 40 | PZT | 3.4 | 60 | 20 | A |
| EXAMPLE 14 | Cyanoethylated PVA | 55 | BaTiO$_3$ | 3000 | 0.5 | 45 | 40 | PZT | 3.4 | 60 | 20 | C |
| EXAMPLE 15 | Cyanoethylated PVA | 40 | BaTiO$_3$ | 3000 | 0.5 | 60 | 40 | PZT | 3.4 | 60 | 20 | C |
| EXAMPLE 15 | Cyanoethylated PVA | 95 | BaTiO$_3$ | 3000 | 0.1 | 5 | 40 | PZT | 3.4 | 60 | 20 | B |
| EXAMPLE 17 | Cyanoethylated PVA | 85 | BaTiO$_3$ | 3000 | 0.1 | 15 | 40 | PZT | 3.4 | 60 | 20 | A |
| EXAMPLE 18 | Cyanoethylated PVA | 70 | BaTiO$_3$ | 3000 | 0.1 | 30 | 40 | PZT | 3.4 | 60 | 20 | A |
| EXAMPLE 19 | Cyanoethylated PVA | 55 | BaTiO$_3$ | 3000 | 0.1 | 45 | 40 | PZT | 3.4 | 60 | 20 | B |
| EXAMPLE 20 | Cyanoethylated PVA | 85 | TiO$_3$ | 80 | 0.5 | 15 | 40 | PZT | 3.4 | 60 | 20 | C |
| EXAMPLE 21 | Cyanoethylated PVA | 85 | SrTiO3 | 300 | 0.5 | 15 | 40 | PZT | 3.4 | 60 | 20 | B |
| EXAMPLE 22 | Cyanoethylated PVA | 85 | BaTiO$_3$ | 3000 | 0.5 | 15 | 40 | PZT | 2.5 | 60 | 20 | A |
| EXAMPLE 23 | Cyanoethylated PVA | 85 | BaTiO$_3$ | 3000 | 0.5 | 15 | 40 | PZT | 10.0 | 60 | 20 | A |
| COMPARATIVE EXAMPLE 1 | Cyanoethylated PVA | 100 | — | — | — | — | 40 | PZT | 3.4 | 60 | 20 | D |
| COMPARATIVE EXAMPLE 2 | Cyanoethylated PVA | 85 | BaTiO$_3$ | 3000 | 0.5 | 15 | 40 | PZT | 1.0 | 60 | 20 | D |
| COMPARATIVE EXAMPLE 3 | Cyanoethylated PVA | 85 | BaTiO$_3$ | 3000 | 1.0 | 15 | 40 | PZT | 3.4 | 60 | 20 | D |
| COMPARATIVE EXAMPLE 4 | Cyanoethylated PVA | 100 | — | — | — | — | 34 | PZT | 3.4 | 66 | 20 | D |

It can be seen from Table 1 that in Examples 1 to 23 of the electroacoustic transducer including the electroacoustic transduction film using the polymer composite piezoelectric body of the present invention, the sound pressure is higher than those of Comparative Examples 1 to 4.

In addition, it can be seen from comparison between Examples 1 to 6, the film thickness of the piezoelectric layer is preferably 10 μm, and more preferably 15 μm to 25 μm.

In addition, it can be seen from comparison between Examples 3 and 7 to 9 that the volume fraction of the piezoelectric body particles in the polymer composite piezoelectric body is preferably more than or equal to 50%.

In addition, it can be seen from comparison between Examples 3 and 10 to 15 that the volume fraction of the dielectric particles in the composite binder is preferably 10% to 30%, and more preferably 20% to 30%.

In addition, it can be seen from comparison between Examples 3, 10, 13, 14, and 16 to 19 and Comparative Example 3, the average particle diameter of the dielectric particles is set to 0.5 μin to exhibit the effect of improving the sound pressure, and is preferably 0.1 μm to 0.5 μm.

In addition, it can be seen from comparison between Examples 3, 20, and 21 that the material of the dielectric particles is preferably barium titanate.

From the above results, the effects of the present invention are obvious.

EXPLANATION OF REFERENCES

10: electroacoustic transduction film
10a, 10c: sheet-like material
10b: laminated body
12: piezoelectric layer
14: lower thin film electrode
16: upper thin film electrode
18: lower protective layer
20: upper protective layer
22: composite binder
23: dielectric particles
24: viscoelastic matrix
26: piezoelectric body particles
30: corona electrode
32: direct-current power source
40, 50, 56: electroacoustic transducer
42: case
42a: pipe
46: viscoelastic supporter
48: frame
52: support plate
54: screw
57: O-ring
58: pressing lid

What is claimed is:

1. A polymer composite piezoelectric body comprising:
a viscoelastic matrix formed of a polymer material having a cyanoethyl group;
piezoelectric body particles which are dispersed in the viscoelastic matrix and have an average particle diameter of more than or equal to 2.5 μm; and
dielectric particles dispersed in the viscoelastic matrix,
wherein the dielectric particles are formed of a material different from that of the piezoelectric body particles and have an average particle diameter of less than or equal to 0.5 μm and a relative permittivity of more than or equal to 80 at 25° C.

2. The polymer composite piezoelectric body according to claim 1,
wherein a volume fraction of the dielectric particles with respect to a total volume of the viscoelastic matrix and the dielectric particles is 5% to 45%.

3. The polymer composite piezoelectric body according to claim 1,
wherein the average particle diameter of the dielectric particles is 0.1 μm to 0.5 μm.

4. The polymer composite piezoelectric body according to claim 2,
wherein the average particle diameter of the dielectric particles is 0.1 μm to 0.5 μm.

5. The polymer composite piezoelectric body according to claim 1,
wherein the dielectric particles are formed of barium titanate.

6. The polymer composite piezoelectric body according to claim 4,
wherein the dielectric particles are formed of barium titanate.

7. The polymer composite piezoelectric body according to claim 1,
wherein the viscoelastic matrix is formed of a polymer material having viscoelasticity at a normal temperature.

8. The polymer composite piezoelectric body according to claim 6,
wherein the viscoelastic matrix is formed of a polymer material having viscoelasticity at a normal temperature.

9. The polymer composite piezoelectric body according to claim 1,
wherein a glass transition temperature of the polymer material at a frequency of 1 Hz is 0° C. to 50° C.

10. The polymer composite piezoelectric body according to claim 8,
wherein a glass transition temperature of the polymer material at a frequency of 1 Hz is 0° C. to 50° C.

11. The polymer composite piezoelectric body according to claim 1,
wherein, a local maximum value of the polymer material at which a loss tangent Tanδ at a frequency of 1 Hz according to dynamic viscoelasticity measurement is greater than or equal to 0.5 is present in a temperature range of 0° C. to 50° C.

12. The polymer composite piezoelectric body according to claim 10,
wherein, a local maximum value of the polymer material at which a loss tangent Tanδ at a frequency of 1 Hz according to dynamic viscoelasticity measurement is greater than or equal to 0.5 is present in a temperature range of 0° C. to 50° C.

13. The polymer composite piezoelectric body according to claim 1,
wherein the polymer material is cyanoethylated polyvinyl alcohol.

14. The polymer composite piezoelectric body according to claim 12,
wherein the polymer material is cyanoethylated polyvinyl alcohol.

15. An electroacoustic transduction film comprising:
a piezoelectric layer using the polymer composite piezoelectric body according to claim 1;
thin film electrodes formed on both surfaces of the piezoelectric layer; and
protective layers laminated on the thin film electrodes.

16. An electroacoustic transduction film comprising:
a piezoelectric layer using the polymer composite piezoelectric body according to claim 14;
thin film electrodes formed on both surfaces of the piezoelectric layer; and
protective layers laminated on the thin film electrodes.

17. The electroacoustic transduction film according to claim 15,
 wherein a thickness of the piezoelectric layer is 15 μm to 25 μm.

18. The electroacoustic transduction film according to claim 16,
 wherein a thickness of the piezoelectric layer is 15 μm to 25 μm.

19. The electroacoustic transduction film according to claim 15,
 wherein a storage elastic modulus E' of the electroacoustic transduction film at a frequency of 1 Hz according to dynamic viscoelasticity measurement is 10 to 30 GPa at 0° C. and 1 to 10 GPa at 50° C.

20. The electroacoustic transduction film according to claim 18,
 wherein a storage elastic modulus E' of the electroacoustic transduction film at a frequency of 1 Hz according to dynamic viscoelasticity measurement is 10 to 30 GPa at 0° C. and 1 to 10 GPa at 50° C.

21. An electroacoustic transducer comprising:
 the electroacoustic transduction film according to claim 15.

22. An electroacoustic transducer comprising:
 the electroacoustic transduction film according to claim 20.

* * * * *